Jan. 8, 1963 YOZO SASAKI ET AL 3,072,733

THERMOELECTRIC GENERATOR

Filed July 17, 1961 2 Sheets-Sheet 1

INVENTORS
YOZO SASAKI
SIZUO ASANABE
BY DAIZABURO SHINODA

OSTROLENK, FABER, GERB & SOFFEN
ATTORNEYS

Jan. 8, 1963

YOZO SASAKI ETAL 3,072,733

THERMOELECTRIC GENERATOR

Filed July 17, 1961

2 Sheets-Sheet 2

INVENTORS
YOZO SASAKI
SIZUO ASANABE
BY DAIZABURO SHINODA

OSTROLENK, FABER, GERB & SOFFEN
ATTORNEYS 3,072,733

THERMOELECTRIC GENERATOR

Yozo Sasaki, Sizuo Asanabe, and Daizaburo Shinoda, all of 2 Shikokumachi, Shiba Mita, Minatoku, Tokyo, Japan Filed July 17, 1961, Ser. No. 124,702
17 Claims. (Cl. 136—5)

Our invention relates to a thermoelectric generator and more particularly to thermoelectric generator components, their composition and to the method of manufacturing them.

Thermoelectric generators find widespread use as temperature measuring devices which produce an electromotive force proportional to the temperature difference present. Thermoelectric generators of this type are commonly known as thermels or thermocouples.

The thermoelectric generator is fundamentally composed of p- and n-type materials connected in series, and its conversion efficiency increases with increasing operating temperature and the figure of merit of the elements. The figure of merit is a characteristic of the specific material employed as is defined as $$F.M.=\frac{\alpha^2}{\rho G_t}$$

where F.M. is the figure of merit, $\alpha$ is the thermoelectric power, $\rho$ is the electrical resistivity and $G_t$ is the thermal conductivity. It is important to obtain a high figure of merit (F.M.) in order to provide a thermoelectric generator having a high degree of both sensitivity and efficiency.

The composition of our invention is so designated as to present materials in which the figure of merit remains large through very high temperature operation, resulting in the large value of the conversion efficiency. In the case of metals the figure of merit is usually very small, because the thermoelectric power is very small in spite of the small value of the product of electrical resistivity and thermal conductivity; the maximum value of the conversion efficiency is as low as 3.1% for bismuth Bi-antimony Sb, the best combination in all metals, assuming that the temperature of the cold junction is 300° K. and that of the hot junction 700° K. This is the reason why semiconductors which have large thermoelectric power are usually used.

In the case of semiconductors the situation can be classified into two classes: one is for a low energy gap semiconductor and the rest for a high energy gap semiconductor. In the former case, the product of electrical resistivity ($\rho$) and thermal conductivity ($G_t$) is relatively small but the thermoelectric power decreases abruptly at relatively low temperatures. In the latter case, however, the thermoelectric power remains nearly constant in relatively high temperature ranges, but the product of electrical resistivity and thermal conductivity ($\rho G_t$) is very large due to large lattice thermal conductivity. For example, in the case of bismuth telluride $Bi_2Te_3$ of which the figure of merit at room temperature is $10^{-3}$ deg.$^{-1}$, the largest in all of the semiconductors known so far, the conversion efficiency is no more than 6% because of the limitation of the temperature at the hot junction.

This invention relates partly to the new types of thermoelectric elements improving some of the faults described above and more particularly to the use of the silicides of some transition metals in which cobalt silicide CoSi is used for n-type element and chromium silicide $CrSi_2$ for p-type element.

It is therefore one object of our invention to provide a thermoelectric generator comprised of a novel combination of silicides of transition metals which produce a high conversion efficiency.

Another object of our invention is to provide a method of forming a thermoelectric generator which includes mixing the compounds employed at the junction of the compounds which includes the steps of pressing the pulverized thermoelectric compounds into a desired form and sintering it at high temperature to produce a p-n junction between the p- and n-branches.

Still another object of our invention is to provide a thermoelectric generator which is comprised of at least the silicide of transition metal as one element.

Another object of our invention is to provide a method of forming a thermoelectric generator which includes the steps of admixing and sintering the thermoelectric elements.

The invention will be more fully understood from the following description when taken in connection with the accompanying drawings, in which.

Figure 1:
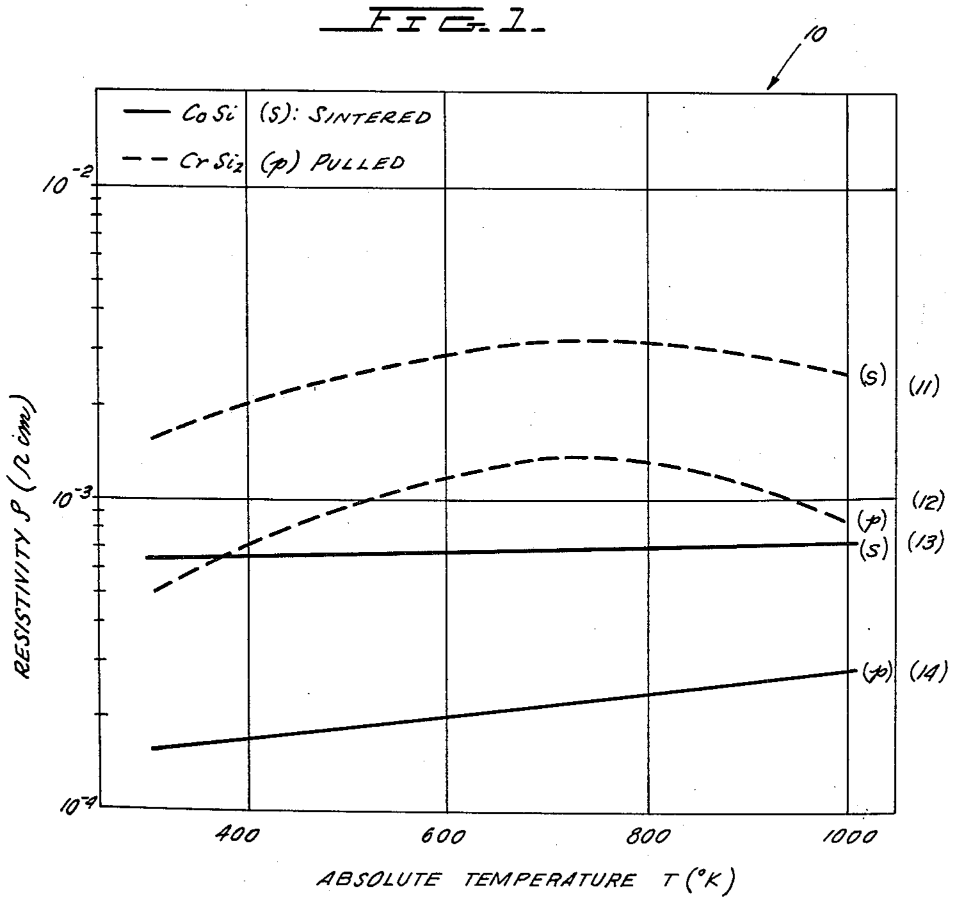
FIGURE 1 is a graph showing the resistivity curves for cobalt silicide and chromium silicide plotted against absolute temperature.

Referring now to the drawings, FIGURE 1 shows a graph 10 wherein the increasing temperature T is plotted along the ordinate and increasing resistivity $\rho$ is plotted along the abscissa. Resistivity $\rho$ is plotted on a logarithmic scale.

It can be seen that the resistivity $\rho$ of cobalt silicide which is sintered in treatment is substantially constant, lying between 6 and $7\times10^{-4}$ ohm-cm. in the 300 to 1,000° K. range, while the pulled cobalt silicide varies between 1 and $3\times10^{-4}$ ohm-cm. in the same temperature range.

The chromium silicide resistivity although not quite as flat as that of cobalt silicide is nevertheless substantially small, lying in the range of 12 to $30\times10^{-4}$ ohm-cm. and 5 to $13\times10^{-4}$ ohm-cm. for sintered and pulled chromium silicides respectively.

Prior art operations and devices with which the present application is concerned are described, for instance, in the prior art publications listed below:

Recent Progress in Thermoelectricity by S. J. Angello, Electrical Engineering, May 1960, 353.

$InAs_{1-x}P_{-x}$ as a Thermoelectric Material by R. Bowers, J. E. Bauerle and A. J. Cornish: J. Appl. Phys., 30 (1959), 1050.

U.S. Patent 2,921,973 entitled "Thermoelements and Devices Embodying Them," issued January 19, 1960 to R. R. Heikes and W. D. Johnston.

Semiconductor Materials for Thermoelectric Power Generator by F. D. Rosi, E. E. Hockings and N. E. Lindenblad R.C.C. Rev. 22 (1961), 82.

Thermoelectric Materials and Devices by J. R. Gambins Reinhold Publishing Corp., New York, 1960.

Direct Conversion of Heat to Electricity by J. Kaye and J. Welsh, John Wiley and Sons, Inc., New York, 1960.

Properties of PbSe Prepared by Power-Metallurgy Techniques by J. F. Miller and R. C. Heimes, J. Electrochem. Soc., 107 (1960), 915.

Measurement of Press Effect on the Seebeck Coefficient of Powder Compacts by A. P. Young, P. B. Robbins and W. B. Wilson: Rev. Sci. Instr., 31 (1960), 70N.

To simplify the description of the present invention, it is assumed that all operations and operating elements of such known systems are to be considered part of the present disclosure, except for the modifications and features of the present invention as hereinafter described.

Figure 2:
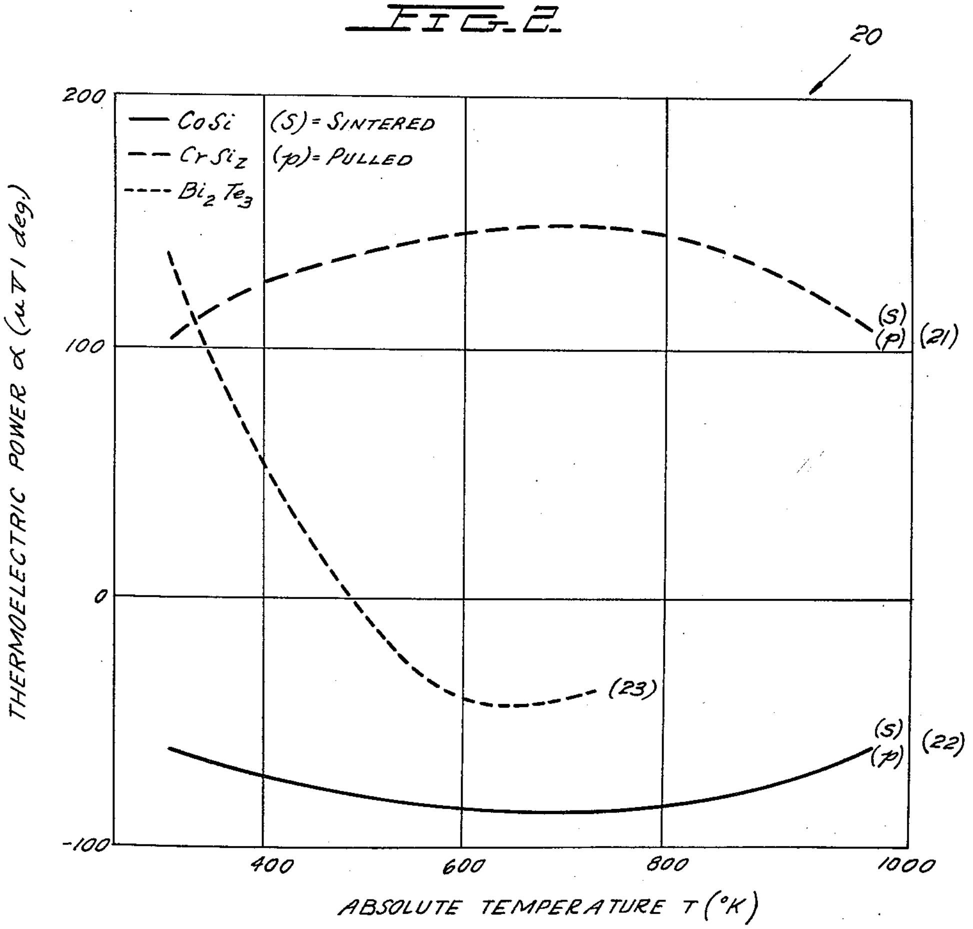
FIGURE 2 is a graph showing the relationship between thermoelectric power and absolute temperature for cobalt silicide, chromium silicide and bismuth telluride.

In FIGURE 2, the thermoelectric power of bismuth telluride $Bi_2Te_3$ is also shown for the sake of comparison with those of cobalt silicide CoSi and chromium silicide $CrSi_2$.

Another feature of these materials is that they have large thermoelectric power, as large as −100 μv./deg. for cobalt silicide CoSi and 150 μv./deg. for chromium silicide $CrSi_2$, and it is remarkable that their magnitudes do not substantially reduce with increasing temperature which characteristic makes these compounds quite different from the case of low energy gap semiconductors. This can clearly be seen in FIGURE 2 which portrays the plots for both cobalt silicide 22 and chromium silicide 21. The thermoelectric power of both silicides is greater than that of bismuth telluride 23 throughout almost the entire temperature range. A second feature of this invention is that the electrical resistivity of the materials lies in the range between metals and semiconductors, and furthermore, the thermal conductivity is relatively small compared with high energy gap semiconductors; the values for cobalt silicide CoSi and chromium silicide $CrSi_2$ are 0.094 and 0.065 w./deg. cm. respectively and for silicon Si and gallium arsenide GaAs, high energy gap semiconductors, 1.5 and 0.6 w./deg. cm., respectively.

The third feature of this invention is that these compounds have high melting points such as 1733° K. for cobalt silicide CoSi and 1823° K. for chromium silicide $CrSi_2$, respectively. Accompanying the first feature, this shows that we can expose the thermoelectric generator hot junction to very high temperatures.

Another feature of this invention relates to the novel method of manufacturing the thermoelectric elements. The most difficult problem in the construction of the thermoelectric generator pertains to the method of construction of the hot junction. The conventional brazing method is undesirable from the following points of view: oxidation, contact resistance, thermal stress, etc.

The instant invention presents a new type thermoelectric element in which a p-n junction is formed by means of a pressing and sintering process in place of a conventional brazing method.

Explaining this method in detail: Each of the n-type and p-type semiconductive materials, for example, chromium silicide $CrSi_2$ and cobalt silicide CoSi, is preliminarily crushed into such fine grains that they can pass through a more-than-100-mesh sieve. A portion of each of the two sorts of grains are mixed up to form a mixture, for example, $CoSi+CrSi_2$. The remaining portions of each of the two sorts of the grains are employed to form each of the parallel rod-like arms of the U-shaped unit of the thermoelectric generator. The mixture of the grains is employed to form the p-n junction portion connecting the two arms. After being arranged in the U-shape, the two separated sorts of grains, cobalt silicide CoSi and chromium silicide $CrSi_2$, and the mixture, $CoSi+CrSi_2$, are pressed by means of a press of 2 to 5 tons/cm.², and then sintered for four hours at 1200° C. in an argon atmosphere.

Figure 3:
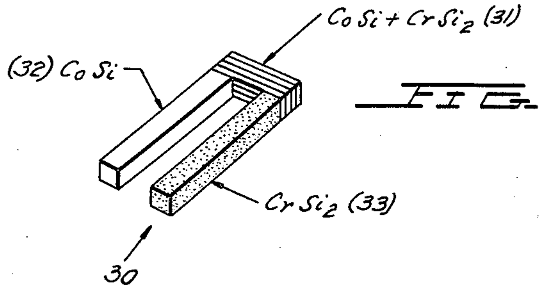
FIGURE 3 is a perspective view of a preferred embodiment of our novel thermoelectric generator.

Thus a U-shaped thermoelectric generator unit 30 shown in FIGURE 3 is obtained. In operation, the p-n junction portion 31 comprising the mixture, $CoSi+CrSi_2$, is heated to a high temperature, while the free end portions of the parallel arms CoSi 32 and $CrSi_2$ 33, are air-cooled or water-cooled. A thermo-insulating wall may be placed between the junction portion and the free end portion of the arms perpendicularly thereto. A thermoelectric voltage is available across the free ends of the arms.

Such unit may be used by itself as a thermoelectric generator. Alternatively, in arranging a thermoelectric generator, a number of the units may be electrically connected in a serial fashion by way of disposing the unlike arms of the successive units in juxtaposed relation and soldering or otherwise connecting the free ends of the adjacent units.

As will be seen from FIGURES 1 and 2, no appreciable changes in either the electrical resistivity and thermoelectric power are observed, between the materials, for example, CoSi or $CrSi_2$, manufactured in a well-known pulling-up method and the materials manufactured in the sintering method of this invention.

Inasmuch as the materials are crushed into grains and then pressed and sintered, the units are mechanically strong, even if the materials are very brittle.

The first feature of this invention is that no matter how brittle, the mechanical intensity of the material is increased and the thermoelectric properties are not so much impaired by sintering process. The second feature is the superior characteristics of a p-n junction in which there is no oxidation, contact resistance and thermal stress of the degree found in like junctions formed by conventional brazing.

The thermoelectric generator composed of cobalt silicide CoSi and chromium silicide $CrSi_2$ by means of pressing and sintering processes can be operated at elevated temperatures for a long period with no appreciable wear and its conversion efficiency is as high as 10%.

In the foregoing, this invention has been described only in connection with preferred embodiments thereof. Many variations and modifications of the principles of the present invention within the scope of the description herein are obvious. Accordingly, it is preferred to be bound not by the specific disclosure herein, but only by the appending claims.

What is claimed is:

1. The method of producing a thermoelectric generator comprising the steps of pressing cobalt silicide and a second transition metal into a substantially U-shaped member and sintering the U-shaped member said method including admixing said cobalt silicide and said second metal to form a p-n junction therebetween.

2. The method of claim 1 wherein the step of sintering includes the step of pulverizing the cobalt silicide into fine grains.

3. The method of claim 2 wherein the step of sintering further includes the step of submitting only grains finer than 100 mesh to the pressing operation.

4. The method of claim 3 wherein the step of pressing includes the step of applying a surface pressure of 2 to 5 tons/cm.² to the U-shaped bar.

5. The method of claim 4 wherein the step of sintering includes the step of immersing the substantially U-shaped bar in an argon atmosphere at a temperature of approximately 1200° C. for a period of approximately 4 hours.

6. The method of producing a thermoelectric generator comprising the steps of arranging cobalt silicide and chromium silicide into a substantially U-shaped bar with each silicide forming one arm of the bar, and sintering the substantially U-shaped bar said method including joining said arms at the central portion of said U-shaped bar to form a p-n junction therebetween.

7. The method of claim 6 wherein the step of pressing includes pulverizing the cobalt silicide and the chromium silicide each into fine grains.

8. The method of claim 7 wherein the step of pulverizing includes the step of exposing only grains of finer than 100 mesh to the pressing operation.

9. The method of claim 8 wherein the step of pressing includes the step of applying a surface pressure of 2 to 5 tons/cm.² to the substantially U-shaped bar.

10. The method of claim 9 wherein the step of sintering includes the step of immersing the substantially U-shaped bar in an argon atmosphere at a temperature of approximately 1200° C. for a period of approximately 4 hours.

11. A method of producing a thermoelectric generator comprising the steps of pulverizing cobalt silicide and chromium silicide each into fine grains, mixing a portion of the pulverized cobalt silicide with a portion of the pulverized chromium silicide; forming an elongated member with the pulverized material wherein one end of the member is formed of the pulverized chromium silicide, the other end of the member is formed of the cobalt silicide and the central portion of said member is formed of the admixed silicides to form a p-n junction; pressing the elongated member; and sintering the elongated member.

12. The method of claim 11 wherein the step of forming the elongated member includes the step of accepting only grains finer than 100 mesh for use in the elongated member.

13. The method set forth in claim 12 wherein the step of pressing includes applying a surface pressure of 2 to 5 tons/cm.$^2$ to the surface of the elongated member.

14. The method set forth in claim 13 wherein the step of sintering the elongated member includes the step of immersing the member in an atmosphere of argon at approximately 1200° C. for approximately 4 hours.

15. A thermoelectric generator comprising an elongated member; a first end of said member being of chromium silicide; a second end of said member being of cobalt silicide; the central portion of said member being the junction of said first and second ends for receiving heat applied thereto; the free ends of said elongated member each being connectible to an associated terminal for producing an electromotive force proportional to the heat applied to said central portion.

16. A thermoelectric generator comprising an elongated member; a first end of said member being of chromium silicide; a second end of said member being of cobalt silicide; the central portion of said member being the junction of said first and second ends for receiving heat applied thereto; the free ends of said elongated member each being connectible to an associated terminal for producing an electromotive force proportional to the heat applied to said central portion, said central portion being a granulated mixture of said silicides to produce an interface which increases the sensitivity of said thermoelectric generator.

17. A thermoelectric generator comprising an elongated member; a first end of said member being of chromium silicide; a second end of said member being of cobalt silicide; the central portion of said member being the junction of said first and second ends for receiving heat applied thereto; the free ends of said elongated member each being connectible to an associated terminal for producing an electromotive force proportional to the heat applied to said central portion, said central portion being a granulated mixture of said silicides to produce an interface which increases the sensitivity of said thermoelectric generator, said elongated member having a substantially U-shaped configuration.

References Cited in the file of this patent

UNITED STATES PATENTS

| | | |
|---|---|---|
| 2,745,928 | Glaser | May 15, 1956 |
| 2,955,145 | Schrewelius | Oct. 4, 1960 |

OTHER REFERENCES

Thermoelectricity, Electronic Industries, July 1959, page 77.

Thermoelectric Materials, ASTIA, Ad. No. 240,677, August 9, 1960, 12 pages.